(12) United States Patent
Ochi

(10) Patent No.: US 11,689,170 B2
(45) Date of Patent: Jun. 27, 2023

(54) TRANSIENT NOISE REDUCTION FILTERING SYSTEM

(71) Applicant: Analog Power Conversion LLC, Bend, OR (US)

(72) Inventor: Sam Seiichiro Ochi, Lakewood Ranch, FL (US)

(73) Assignee: Analog Power Conversion LLC, Bend, OR (US)

( * ) Notice: Subject to any disclaimer, the term of this patent is extended or adjusted under 35 U.S.C. 154(b) by 0 days.

(21) Appl. No.: 17/014,948

(22) Filed: Sep. 8, 2020

(65) Prior Publication Data

US 2021/0075388 A1    Mar. 11, 2021

Related U.S. Application Data

(60) Provisional application No. 62/897,085, filed on Sep. 6, 2019.

(51) Int. Cl.
| H03H 1/00 | (2006.01) |
| H03H 7/42 | (2006.01) |
| H01R 13/719 | (2011.01) |

(52) U.S. Cl.
CPC ......... H03H 1/0007 (2013.01); H01R 13/719 (2013.01); H03H 7/427 (2013.01)

(58) Field of Classification Search
CPC .............................. H03H 1/0007; H03H 7/427
USPC .................................................. 333/177, 181
See application file for complete search history.

(56) References Cited

U.S. PATENT DOCUMENTS

| 4,751,607 | A | * | 6/1988 | Smith | ...................... H04B 3/28 361/135 |
| 5,971,813 | A | | 10/1999 | Kunz et al. | |
| 6,150,896 | A | * | 11/2000 | DeCramer | ............. H04N 7/108 348/E7.051 |
| 10,060,965 | B1 | * | 8/2018 | Skinner | ................ G01R 31/086 |
| 2004/0227622 | A1 | | 11/2004 | Giannini et al. | |
| 2014/0211095 | A1 | | 7/2014 | Dickens et al. | |
| 2016/0380425 | A1 | * | 12/2016 | Chapman | .......... H02M 3/33573 363/21.01 |
| 2017/0187472 | A1 | | 6/2017 | Chini et al. | |
| 2018/0254931 | A1 | | 9/2018 | Gardner | |
| 2018/0286577 | A1 | * | 10/2018 | Renteria | ................. H01F 27/29 |

(Continued)

FOREIGN PATENT DOCUMENTS

| EP | 0799525 B1 | 5/2003 |
| JP | 2011004119 A | 1/2011 |

OTHER PUBLICATIONS

Search Report dated Dec. 15, 2020 for PCT Application No. PCT/US2020/049760.

(Continued)

*Primary Examiner* — Rakesh B Patel

(57) ABSTRACT

A transient noise reduction filter comprises a cable including one or more twisted pairs of conductors and one or more common mode chokes (CMCs). The one or more CMCs a formed from respective pluralities of turns of the cable. Each of the CMCs may be a magnetic CMC wherein the plurality of turns of the cable are wrapped around a magnetic core, or an air-core CMC wherein the plurality of turns of the cable are not wrapped around a magnetic core but are instead disposed around a non-magnetic material (such as air)

15 Claims, 8 Drawing Sheets

(56) References Cited

U.S. PATENT DOCUMENTS

2019/0029499 A1* 1/2019 Petersen ................. H01F 17/04
2019/0272940 A1* 9/2019 Hashimoto ........... H01F 17/045

OTHER PUBLICATIONS

Examination Report for related IN application No. 202227016258, dated Nov. 18, 2022.

* cited by examiner

FIG. 1

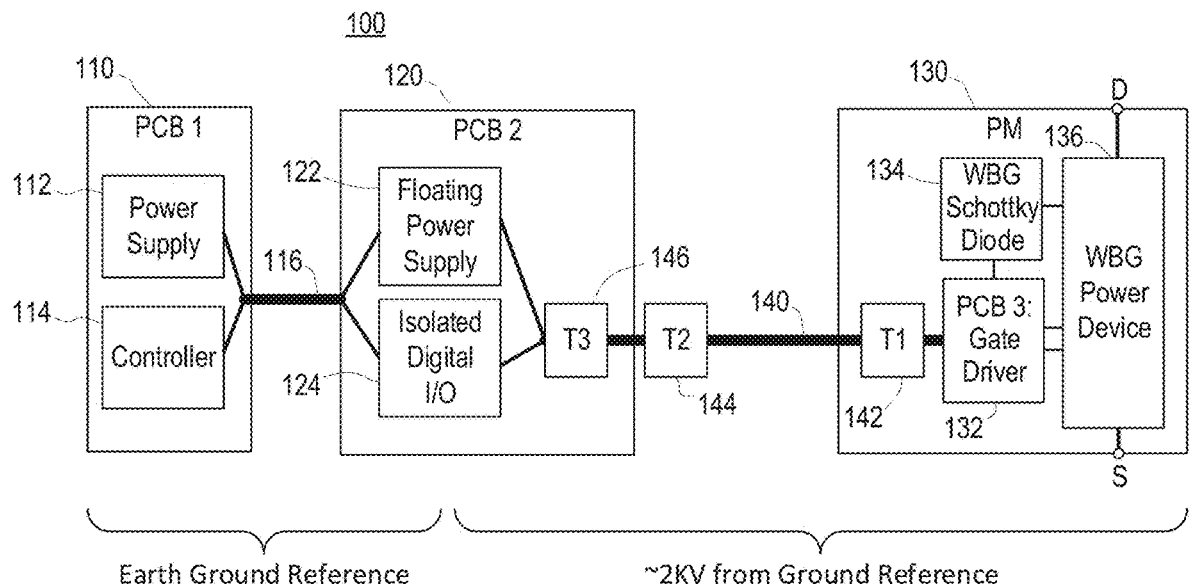

FIG. 2

| Parameter | Conditions | Min | Typ | Max | Units |
|---|---|---|---|---|---|
| Common Mode Transient Immunity (CMTI) | Turns of Cat 6 Cable on Toroid | 500 | 1000 | 2000 | V/ns |
| Switching Frequency Range, $f_{SW}$ | | | 1 | 200 | KHz |
| Input to Output Delays, $t_d$ | | | 50 | 70 | ns |
| Rise Time, $t_r$ | 50A, 3.3KV SiC MOSFET (Cin = 4nF) | | | 20 | ns |
| Fall Time, tf | 50A, 3.3KV SiC MOSFET (Cin = 4nF) | | | 20 | ns |
| Desaturation/Overcurent Detection Threshold, $V_{DSTH}$ | Externally Adjustable | | | 10 | V |
| Diode Clamp Voltage Set, $V_{DSAT}$ | Externally Adjustable | | | 18 | V |
| Overcurrent Comparator Delay, $V_{DSAT}$ to $V_{FBar}$ | | | | 20 | ns |
| Overcurrent Blanking | Externally Adjustable | | | 400 | ns |

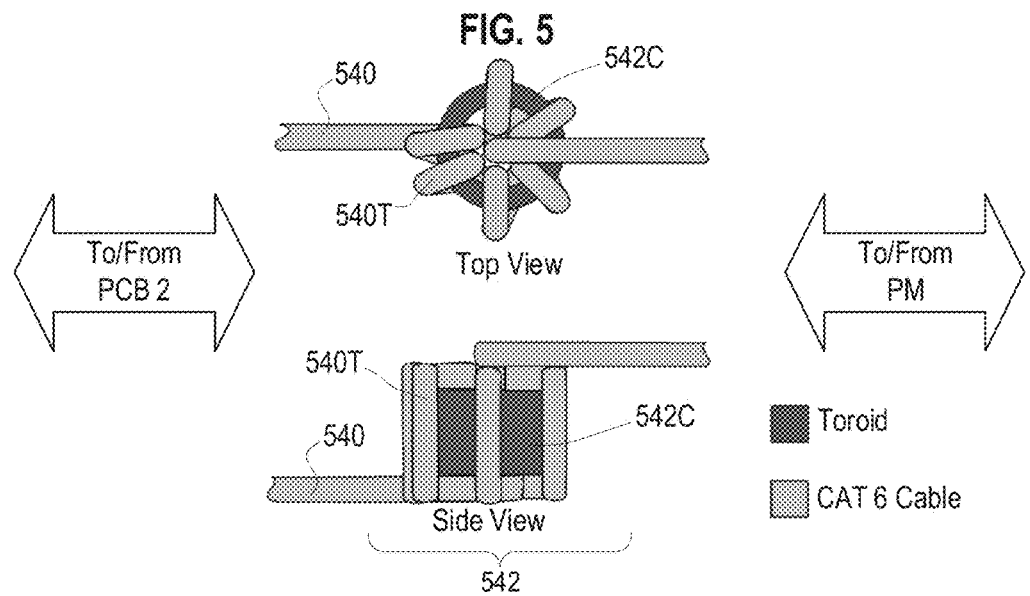
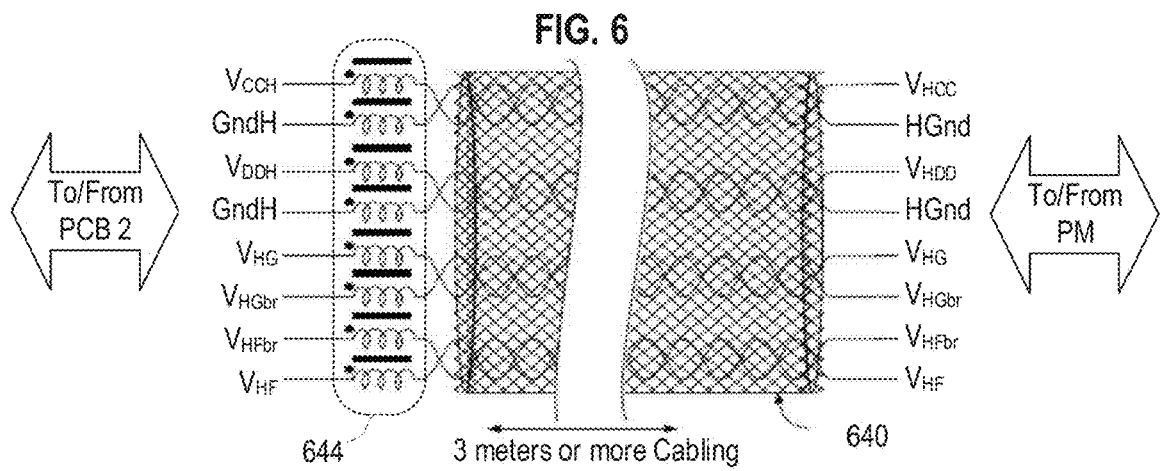
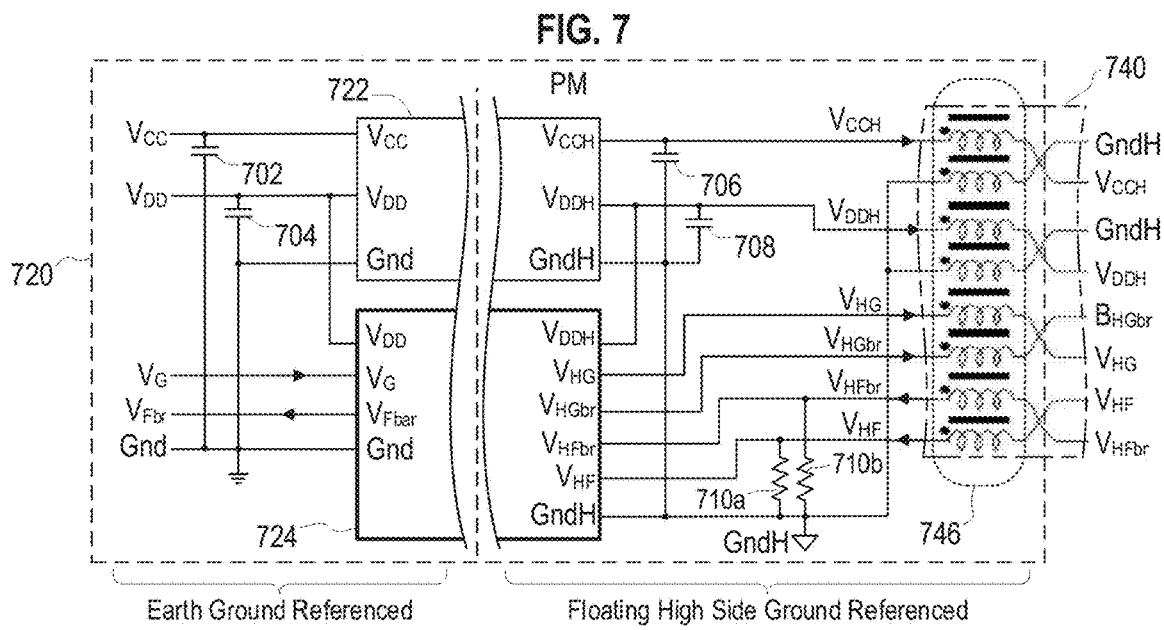

TRANSIENT NOISE REDUCTION FILTERING SYSTEM

CROSS-REFERENCE TO RELATED APPLICATION

This application claims the benefit of U.S. Provisional Patent Application No. 62/897,085, filed Sep. 6, 2019, which is incorporated by reference herein in its entirety.

BACKGROUND

Power semiconductor devices are used in many different industries. Some of these industries, such as telecommunications, computing, and charging systems, are rapidly developing. Those industries would benefit from improved semiconductor device characteristics, including reliability, switching speed, low noise, and high fault tolerance, and miniaturization.

Wide-bandgap semiconductor (WBG) devices, such as Silicon Carbide (SiC) devices, include power devices that offer high current and high voltage capabilities with high switching speed. WBG power devices may include, for example, Metal-Oxide-Semiconductor Field Effect Transistors (MOSFETs), Insulated Gate Bipolar Transistors (IGBTs), Bipolar Junction Transistors (BJTs), and Junction Field Effect Transistors (FETs), as well as diodes such as Schottky diodes.

WBG devices typically need a low-impedance gate driver, which must be located in close proximity to the WBG power device. Furthermore, in high-power applications, WBG power devices may need to dissipate substantial amounts of heat, which requires that the WBG power devices not be physically encroached upon by the control electronics.

Furthermore, the high switching speeds and high current capacity of WBG devices may generate large changes in current flowing through the device pre unit time (i.e. large $\delta I/\delta t$). Because of the inherent parasitic inductances present in the circuit, the large $\delta I/\delta t$ may generate large fast voltage spikes (i.e., $\delta V/\delta t$ noise). The $\delta V/\delta t$ noise, if allowed to propagate to the control electronics for the WBG device, may cause the control electronics to malfunction or be damaged.

At the same time, the control electronics must be able to react quickly to breakdown conditions when off, or overcurrent and short circuit conditions when on that may arise, because such conditions can damage or destroy the WBG device if not responded to quickly enough.

Accordingly, a need exists for controlling a WBG device without interfering with heat extraction from the WBG device, and for protecting the electronics that control the WBG device from $\delta V/\delta t$ noise generated by the operation the WBG device without causing undue delay in signals being communicated between the control electronics and the WBG device.

SUMMARY OF THE INVENTION

Embodiments relate to providing protection against noise spikes having high changes in voltage per unit time ($\delta V/\delta t$) such as noise spikes on the order of 500 to 2000 Volts/nanosecond (V/ns) or greater. Such noise spikes may be commonly generated by high-speed, high-power switching devices, such as power devices fabricated from wide bandgap (WBG) semiconductors. A device providing the above protection may be common mode transient noise reduction filter.

In an embodiment, a transient noise reduction filter comprises one or more common mode chokes (CMCs) and a cable including one or more twisted pairs of conductors. The one or more CMCs a formed from respective pluralities of turns of the cable.

In an embodiment, one of the one ore more CMCs may be a magnetic CMC wherein the respective plurality of turns of the cable are wrapped around a magnetic core.

In an embodiment, one of the one ore more CMCs may be an air-core CMC wherein the plurality of turns of the cable are not wrapped around a magnetic core but are instead disposed around a non-magnetic material (such as air).

BRIEF DESCRIPTION OF THE DRAWINGS

FIG. 1 illustrates a system according to an embodiment, the system including a WBG power device.

FIG. 2 presents a table showing characteristics of a system including a WBG power device according to an embodiment.

FIG. 5 illustrates a Common Mode Choke (CMC) according to an embodiment.

FIG. 6 illustrates a second CMC according to an embodiment.

FIG. 7 illustrates a second PCB including a third CMC and an isolation circuit according to an embodiment.

DETAILED DESCRIPTION

Figure 3:
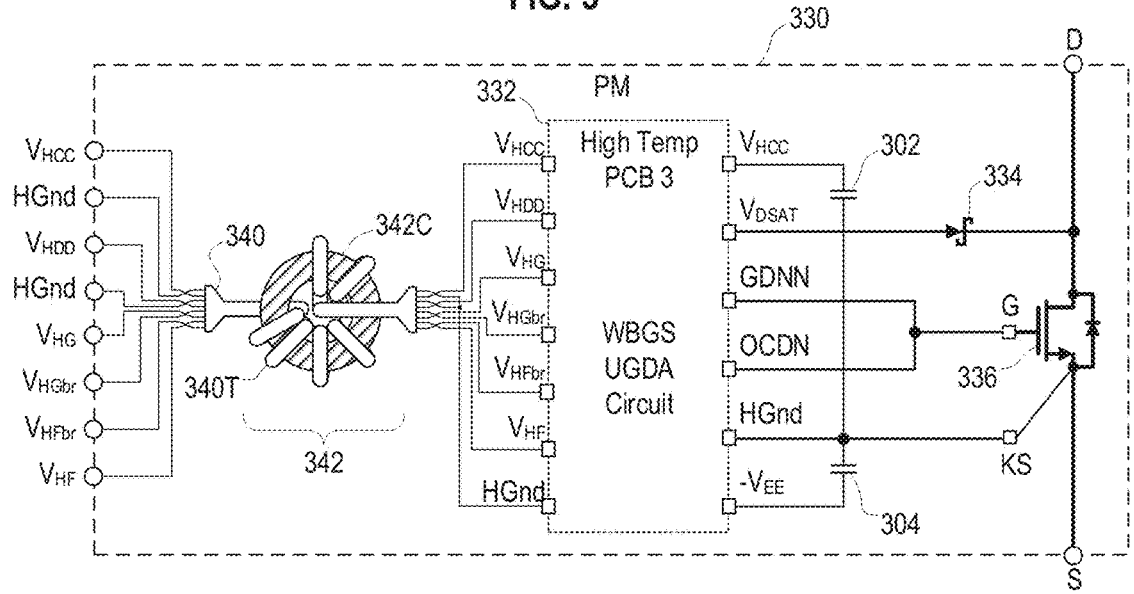
FIG. 3 illustrates a Power Module (PM) according to an embodiment.

Embodiments of the present application relate to enabling high speed switching, low noise, and high fault tolerance for devices fabricated on wide band gap semiconductors, such as silicon carbide (SiC), gallium nitride (GaN), gallium oxide ($Ga_2O_3$), and diamond. However, embodiments may be applied to systems using devices fabricated on other semiconductors, such as silicon, germanium, gallium arsenide (GaAs), and the like.

The present disclosure relates to power semiconductor devices including a Universal Gate Drive Amplifier (UGDA) and Common Mode high δV/δt Noise Interference Filter (that is, a common mode transient noise reduction filter). A UGDA places an amplifier die in the power module (PM) with the dies of the power device. It simplifies the drive and feedback requirements from a complex mixed signal high current and voltage problem to a simple, multichannel standard digital input and output logic interface. The digital input and output logic interface allows signals to be propagated from the PM to the control electronics over multi-conductor twisted-pair cable, such as the American National Standards Institute/Telecommunications Industry Association standard ANSI/TIA-568 Category 6 ("Cat 6") cables.

The common mode transient noise reduction filter reduces the very high δV/δt noise of ~200V/ns to as much as ~2000V/ns generated by the latest high speed WBG power devices (such as those fabricated on SiC or GaN) to a more reasonable <50V/ns levels. The common mode transient noise reduction filter makes possible error free signal control and feedback to high speed WBG power devices.

Universal Gate Drive Amplifier (UGDA)

Power Modules (PMs) may be used in electric vehicles (EVs), EV fast chargers, data centers, energy storage systems, aerospace, and so on. Embodiments provide much higher performance (as much as 10x) and protection than provided by solutions of the related arts. Faster and safer switching enables higher electrical efficiency, reduced heat removal, and lighter and smaller PMs.

Furthermore, embodiments provide these performance and protection benefits for all present and future semiconductor power devices.

FIG. 1 illustrates a system 100 according to an embodiment, the system including a WBG power device 136. The system 100 enabling fastest switching for current & future WBG power devices while minimizing over voltages, inadvertent faults, and other switching issues, and providing the extremely fast overcurrent and/or desaturation protection needed by these devices to achieve reliable performance in many applications. In addition, embodiments may provide overvoltage or avalanche breakdown detection, or both, and may in response turn on the WBG power device 136 extremely quickly to prevent damage to the circuitry of the system 100.

The system 100 includes first, second, and third printed circuit boards (PCBs): the first PCB 110 (PCB 1) is a control board, the second PCB 120 (PCB 2) is a bridge daughter board, and the third PCB 132 (PCB 3) is a universal gate drive amplifier (UGDA) board included in a power module (PM) 130. The three PCBs 110, 120, and 132 are connected by a low inductance shielded command, control, communications data cable 140 (hereinafter, first cable 140).

The first PCB 110 and the left half of the second PCB 120 operate using an earth ground as a reference. In contrast, the right half of the second PCB 120 and the PM 130 may operate with a floating ground reference that may be as much as 2000 volts higher or lower that the earth ground.

The PM 130 includes the third PCB 132, a WBG Schottky diode 134, and a WBG power device 136. In an embodiment, the Schottky diode 134 is a SiC Schottky barrier diode (SBD), and the power device 136 is a 3.3 kV SiC MOSFET die, but embodiments are not limited thereto. In an embodiment, the PM 130 may operate at an operating temperature of 25 degrees C. and a red line of 150 degrees C. In another embodiment wherein all the discrete components of the PM 130 are high temperature silicon-on-insulator (SOI) based components, the PM 130 may operate at up to 250 degrees C. In yet another embodiment, the PM 130 may be composed of full WBG components, both the power switching devices, Schottky diode and a WBG integrated circuit that all operate at up to 900 degrees C. The PM 130 does not include a daughter board that would sit on top of the PM to limit inductances, as often done in the related arts; such daughter cards would typically limit the performance of the WBG power device 136.

The PM 130 also includes a first CMC 142 to achieve Common Mode Transient noise Immunity (CMTI) of over 500V/ns to 2000V/ns dV/dt. The PM 130 shown in FIG. 1 can be the low side or the high side switch in an application, with potential ranging from earth ground to ~2 kV from ground. The disclosed technique does not appear to have any practical limits to the working potentials above or below ground nor CMTI above 2000V/ns dV/dt.

In the embodiment of FIG. 1, the PM 130 communicates with the second PCB 120 via the first cable 140, which may be a standard CAT 6 cable including multiple twisted pairs of conductors. The first cable 140 may be a high temperature rated CAT 6 cable. The second PCB 120 includes one or more floating power supplies 122 to power the third PCB 132, and an isolated digital Input/Output (I/O) circuit 124 that includes high speed digital isolated couplers to provide a (digital) gate drive signal to the third PCB 132 and to receive a (digital) fault output from the third PCB 132. The fault output from the third PCB 132 is converted back to an earth ground referenced signal that is provided to the first PCB 110. CMTI protection for the first cable 140 between the second PCB 120 and the PM 130 may be provided by first, second, and third CMCs 142, 144, and 146. Although FIG. 1 shows a system including three CMCs, embodiments are not limited thereto, and in embodiments, the first cable 140 may have more or fewer CMCs protecting it.

The first PCB 110 communicates with the second PCB 120 using a second cable 116, which may also be a CAT 6 cable. The first PCB 110 may include one or more power supplies 112 for the second PCB 120 and may also include a controller circuit 114 that exchanges digital signals with the second PCB 120. The controller circuit 114 provides the necessary digital and analog signal processing memory, and programmed intelligence to implement whatever end application such as an electrical vehicle, windmill, electric pump, electric lighting, power conversion device, or any other electrically operated and controlled electric machine.

Without sacrificing switching speed or low latency, in an embodiment, the first PCB 110 and the second PCB 120 may be separated by 5 meters (that is, the second cable 116 may be five meters long or more) and the distance between PCB 2 and PCB 3 may be 1 meter (that is, the first cable 140 may be one meter or more long). Accordingly, the first PCB 110 may operate in a relatively benign environment (e.g., an ambient temperature of 0 to +70 degrees C.), while the second PCB 120 operates in a more challenging environment (e.g., an ambient temperature of −55 to +85 degrees C.), and the PM 130 operates in harsh environment (e.g., an ambient temperature of −55 to +250 degrees C. today, or even of +400 degrees C. or more). Furthermore, while noise voltage transients with δV/δt of up to 2000V/nanosecond may occur on the PM 130, noise voltage transients on the first and second PCBs 110 and 120 may have δV/δt reduced to 10 V/nanosecond or less.

FIG. 2 presents a table showing illustrative characteristics of a system including a WBG power device according to an embodiment. First, the CMTI, common mode transient noise immunity of >500V/ns, is substantial higher than provided by available commercial gate driver systems. Second, the overcurrent comparator's output, $V_{FBar}$ can provide local overcurrent fault protection and shutdown within the third PCB 132 in less than 20 nanoseconds (ns) with this detected fault being output back to the controller for fault mitigation processing. This low latency and locally implemented protection within the third PCB 132 allows power control techniques such as adaptive dead time control to be used with high power devices, thus improving overall system efficiency. Third, the PM according to an embodiment does not require a daughter board on top, where the least heat tolerant component may limit the performance of the WBG power device. Instead, embodiments place the electronics that might be on a daughter board in systems of the related art at the other end of a cable that may be as much as three meters or more long, far away from heat generated by the WBG power device.

Embodiments may achieve a CMTI of over 500V/ns and up to 2000V/ns based on low cost semi-custom CMTI circuits. In an embodiment, a CMC uses CAT 6 cable wrapped around a high frequency toroid to provide CMTI. The CMTI provided by embodiments are much higher than seen in the switching wave forms shown in the recent SiC MOSFET PMs or demonstration printed circuit boards (PCBs). Locating the third PCB 132 within the same PM 130 that includes the WBG power device 136 and the WBG Schottky diode 134 allows minimization of parasitics related to driving the gate of the WBG power device 136, and also enables including a full set of parasitics into circuit and power system simulations to optimize and protect the switching performance expected of the PM 130. This enables future least energy path designs & simulations.

FIG. 3 illustrates a Power Module (PM) 330 according to an embodiment. The PM 330 may be embodied in the PM 130 of FIG. 1.

The PM 330 includes a first CMC 342, a gate driver PCB 332, a Schottky diode 334, and a power device 336, which may respectively correspond the first CMC 142, the third PCB 132, the WBG Schottky diode 134, and the WBG power device 136 of FIG. 1. In the illustrated embodiment, the Schottky diode 334 and the power device 336 are SiC devices.

The gate driver PCB 332 produces a gate drive signal GDNN and an overcurrent drive signal OCDN. The gate drive signal GDNN is used to turn the power device 336 on and off by charging and discharging a gate capacitance of the gate G of the power device 336. The overcurrent drive signal OCDN is used to turn the power device 336 off by discharging the gate capacitance of the gate G of the power device 336, but may do so at a different rate that than the gate drive signal GDNN. Generally, the gate G of the power device 336 corresponds to a control terminal, and the drain D and source S of the power device 336 correspond to conductance terminals.

The PM 330 receives a first high voltage (HV) positive supply voltage $V_{HCC}$, and second HV positive supply voltage $V_{HDD}$, and a HV ground HGnd via the twisted pair cable 340. The PM 330 also receives a differential HV gate signal $V_{HG}$ and $V_{HGbr}$ from the cable 340, and provides a differential HV fault signal $V_{HF}$ and $V_{HFbr}$ to the cable 340. Here, "HV" refers to the supply voltages being on the floating ground side of the system, not the absolute magnitude of voltages being supplied. The cable 340 is includes a plurality of twisted pairs, with first and second pairs carrying a respective one of the first HV positive supply voltage $V_{HCC}$, the second HV positive supply voltage $V_{HDD}$ on one conductor and the HV ground HGnd on the other, a third pair carrying the differential HV gate signal $V_{HG}$ and $V_{HGbr}$, and a fourth pair carrying the differential HV fault signal $V_{HF}$ and $V_{HFbr}$. The cable 340 has a plurality of lengths 340T wrapped around a ferrite toroid 342C to form the first CMC 342.

Placing the first CMC 342 within the PM 330 decouples floating ground based switching transient noise coupling into the differential HV gate signal $V_{HG}$ and $V_{HGbr}$ on the gate driver PCB 332 in both directions—from the gate driver PCB 332 back to the second PCB 120 of FIG. 1 and from the second PCB 120 to the gate driver PCB 332. The gate driver PCB 332 may be implemented on a high temperature PCB with discrete devices surface mounted directly onto a direct bonded Cu ceramic substrate (DCB) while the power device 336 and Schottky diode 334 are die attached & wire bonded. The gate driver PCB 332 tightly couples to the power device 336 with design & layout minimizing parasitics surrounding the gate driver and the driven power device 336. A Kelvin source (KS) connection is included to assure full direct measurement of the power device 336 gate voltage, unmodified by its source current. Additionally, physical layout focuses on a first bypass capacitor 302 for first HV positive supply voltage $V_{HCC}$ and a second bypass capacitor 302 for HV negative supply voltage $V_{EE}$ in order to ensure low inductances in the gate driver switching power loop.

Some WBG power devices, such as current generation SiC MOSFETs, cannot withstand more than ~1 μs of exposure to high fault current events. Accordingly, it is desirable to detect a fault and softly turn off the device in less than 1 μs.

Figure 4:
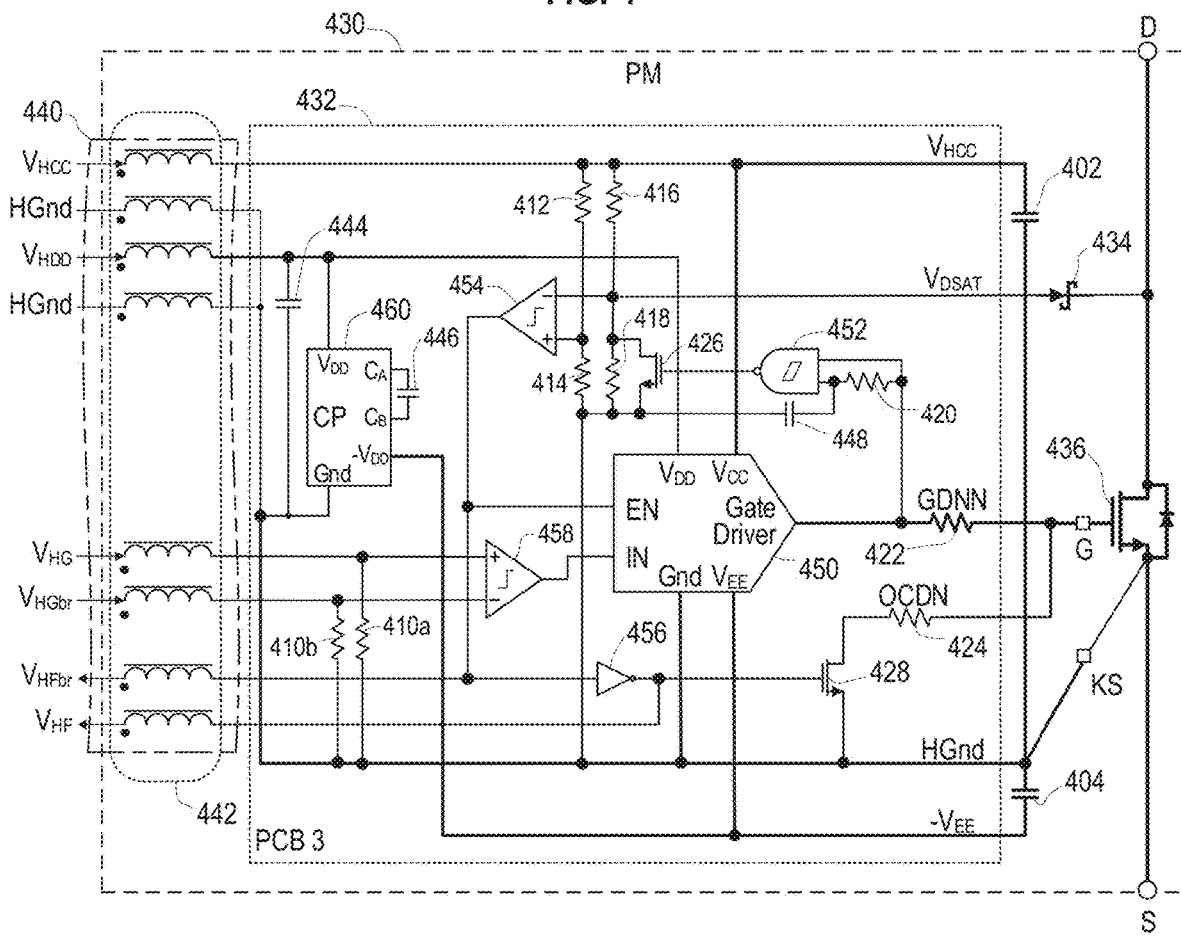
FIG. 4 illustrates further details of a PM according to an embodiment.

FIG. 4 illustrates further details of a gate driver PCB 432 of a PM 430 according to an embodiment. The third PCB 432 may correspond to the third PCB 332 of the PM 330 of FIG. 3. The PM 430 further includes a first CMC 442, a Schottky diode 434, a power device 436, $V_{HCC}$ decoupling capacitor 402, and $V_{EE}$ decoupling capacitor 404, which correspond to similarly-numbered components of the PM 330 of FIG. 3, and accordingly detailed descriptions thereof are omitted in the interest of brevity.

In an embodiment, the first CMC 442 comprises a plurality of turns of a twisted pair cable 440 wound around a high frequency ferrite core. In another embodiment, the CMC 442 comprises a plurality of turns of the cable 440 wound around an air core.

The gate driver PCB 432 includes active devices including a first N-channel MOSFET (nMOSFET) 426, a second nMOSFET 428, a gate driver amplifier 450, a NAND gate 452, a first comparator 454, an inverter 456, a second comparator 458 and a charge pump (CP) circuit 460. The gate driver PCB 432 also includes passive devices including first, second, third, fourth, fifth, sixth, seventh, eighth, and ninth resisters 410a, 412, 414, 416, 418, 420, 422, 424, and 410b, $V_{HDD}$ decoupling capacitor 444, CP capacitor 446, and blanking capacitor 448.

The first resistor 410a and the ninth resistor 410b provide impedance matching for the differential HV gate signal $V_{HG}$ and $V_{HGbr}$ received through the first CMC 442 to match the impedance of the twisted-pair cable 440 that is used to connect the PM 430 to other boards (such as the second PCB 120 of FIG. 1) through the first CMC 442. For example, the first resistor 410a and the ninth resistor 410b may each have a resistance of 50 ohms. The second comparator 458 receives the differential HV gate signal $V_{HG}$ and $V_{HGbr}$ and drives the input signal IN to gate driver amplifier 450 according to the comparison.

The seventh resistor 422 may have a resistance value of 1 ohm to match the impedance created by the gate capacitance of the power device 436 and the parasitic inductances between the output of the gate driver amplifier 450 and the gate G of the power device 436. This low impedance makes it advantageous to have the gate driver amplifier 450 close to the power device 436.

The gate driver PCB 432 includes a fully programmable blanking circuit comprising the NAND gate 453, the first nMOSFET 426, the blanking capacitor 448, and the sixth resistor 420. The blanking circuit can be adjusted to provide a blanking period from well under 1 μs to over 10 μs by the selection the blanking capacitor 448, and the sixth resistor 420. In response to the gate drive signal GDNN turning on the power device 436, the blanking circuit inhibits desaturation/overcurrent detection by the first comparator 454 for the blanking period by shorting the inverting input of the first comparator 454 to ground through the first nMOSFET 426. When the blanking period expires, that is, when the blanking capacitor 448 has been sufficiently charged through the sixth resistor 420 to be considered a logic high signal by the NAND gate 452, the first nMOSFET 426 is turned off and the first comparator 454 is then able to perform desaturation/overcurrent detection by sensing the desaturation voltage $V_{DSAT}$.

During a desaturation or overcurrent event, the drain voltage of the power device 436 reverse-biases the Schottky diode 434. As a result, when detecting the desaturation or overcurrent event is enabled, the desaturation voltage $V_{DSAT}$ voltage rises, charging any parasitic capacitances (including the reverse biased anode to cathode capacitance of the Schottky diode 434) to a voltage defined by respective resistance values $R_{416}$ and $R_{418}$ of the fourth resistor 416 and the fifth resistor 418, $V_{DSAT}=V_{HCC}*R_{418}/(R_{416}+R_{418})$. In response to the desaturation voltage $V_{DSAT}$ rising above a desaturation voltage threshold $V_{DSTH}$ determined by respective resistance values $R_{412}$ and $R_{412}$ of the second resistor 412 and the third resistor 412, $V_{DSTH}=V_{HCC}*R_{414}/(R_{412}+R_{414})$, a comparator delay of the first comparator 454 later (typically 10 nanoseconds (ns) or so) the output of the first comparator 454 is driven low. The output of the first comparator 454 and the output of the inverter 456 are respectively transmitted as the differential HV fault signal $V_{HFbr}$ and $V_{HF}$ through the first CMC 442 back to a controller, such as a controller 114 of the first PCB 110 of FIG. 1.

The output of the first comparator 454 is used to turn off the power device 436. The output of the first comparator 454 drives an enable signal EN of the gate driver amplifier 450, and by driving the enable signal EN low, causes the gate driver amplifier 450 to stop driving the gate drive signal GDNN coupled to the gate G of the power device 436. At the same time, the output of the first comparator 454 through the inverter 456 to turn on the second nMOSFET 428. Turning on the second nMOSFET 428 causes the gate capacitance of the power device 436 to discharge through the eighth resistor 424 to HGnd, turning off the power device 436. The value of the eighth resistor 424 is selected to prevent δV/δt induced over-voltage overshoot and avalanche breakdown of the power device 436 by "slowly" turning it off. Accordingly, the resistance value of the eighth resistor 424 will be higher than a resistance value of the seventh resistor 422 used to turn the power device 436 on and off under normal operating conditions. Using the first comparator 454, the desaturation/overcurrent detection circuit of the gate driver PCB 432 is designed to initiate the shut-down cycle in less than 100 ns, with the HV fault signal $V_{HFbr}$ being sent back to the controller (such as a controller 114 of the first PCB 110 of FIG. 1) even more quickly.

Embodiments may also provide detection and mitigation of overvoltage conditions, avalanche breakdown conditions, or both. This is made possible by the low noise, low electro-magnetic interference (EMI) environment produced by the CMC 442 and the other CMCs of FIG. 1. The low noise allows millivolt detection of voltages present across the drain or source inductances of the power device 436 as a result of unexpected circumstances, such as ionization of the drain depletion area as a result of high energy particle radiation. Such radiation may cause a high energy plasma discharge in a very small volume caused by the trail of the particle. This plasma discharge will cause unexpected current flow from drain to source of the affected power device (including not only SIC semiconductors but also GaAs or silicon semiconductors.) The destruction of the affected device will occur within 10 nanoseconds (ns) if not mitigated. A simple mitigation is to turn on the affected power device to divert the current flow caused by the high energy plasma from its small volume (which may be in form of a path having a cross-sectional area of an atom or a crystalline lattice and a length all the way from the drain to the source of the power devices, approximately 10 micrometers to 100 micrometers) to the total area of the power device. This spreads the heat energy so that rather than being dissipated across the cross section of an atom, it is dissipated across the entire areas of the power device chip.

The PM 430 may be able to withstand δV/δt switching noise from >500 V/ns to 2,000 V/ns. Furthermore, through the use of the first CMC 442, the PM 430 may provide substantially better δV/δt noise immunity than best commercial gate drives of the related art, that may only provide δV/δt noise immunity to 150V/ns.

The system 100 of FIG. 1 includes three CMCs: a first CMC 142 in the PM 130 located just prior to or on the edge of the third PCB 132, a second CMC 144 placed in series with the first cable 140 that connects the second PCB 120 to third PCB 132, and a third CMC 146 within the second PCB 120. The first, second, and third CMCs 142, 144, and 146 are constructed similarly, however the number of turns, the core material, and the physical size of cabling differ for each one.

The first cable 140 may be Cat 6 cable. Cat 6 cable, with its four pairs of twisted wire pairs, each with characteristic impedance of 100, has the property of canceling external magnetic and electric fields surrounding it. The speed at which signals propagate through Cat 6 cable is 75% the speed of light in vacuum, or ~22.5 cm/ns. Accordingly, the latency $t_{delay}$, of one meter of CAT 6 cable is tdelay=(100 cm/22.5 cm)*ns=4.4 ns.

FIG. 5 illustrates a Common Mode Choke (CMC) 542 according to an embodiment. The CMC 542 may correspond to the any of the first, second, or third CMCs 142, 144, and 146 of FIG. 1. Embodiments of the CMC 542 are not limited to having the number of turns The CMC 542 comprises a plurality of turns 540T of a twisted pair cable 540 wound around a core 542C. The twisted pair cable may correspond to the first cable 140 of FIG. 1. In an embodiment, the twisted pair cable 540 is a Cat 6 cable having four twisted pairs of conductors, but embodiments are not limited thereto. Embodiments of the CMC 542 are not limited to having the number of turns 540T shown in FIG. 5.

In an embodiment of the CMC 542 corresponding to the first CMC 142, the core 542C is a high-frequency ferrite core, such as a Fair-Rite® low-permeability 67 material, ui=40, toroid, a Magnetics Kool Mμ® Hf toroid, or the like.

For example, a CMC 542 could use a Fair-Rite part #5967003801, material 67 high frequency toroid having as many as 17 turns of Cat 6 cable with an $A_L$ of 55 nH, creating as much as $(17)^2*55$ nH=15.9 µH common mode inductance for the CMC 542.

In an embodiment of the CMC 542 corresponding to the second CMC 144, the core 542C is a medium bandwidth ferrite core, such as Fair-Rite 5943003801, a ui=800 material toroidal core, or the like. With the Fair-Rite 5943003801 and 17 turns of the Cat 6 cable, the CMC 542 may have a common mode inductance of 310 µH.

In an embodiment of the CMC 542 corresponding to the third CMC 146, the core 542C is a low frequency high permeability ferrite core, such as Fair-Rite 75 material core with ui=5000, or the like. With the Fair-Rite 75 material core and 17 turns of the Cat 6 cable, the CMC 542 may have a common mode inductance of 1.97 mH.

As shown in FIG. 1, the first CMC 142 is just inside the PM 130 and adjacent to the third PCB 132, the second CMC 144 may be located near the second PCB 120 along the first cable 140, and the third CMC 146 is located on an edge of the second PCB 120.

FIG. 6 illustrates schematically a second CMC 644 according to an embodiment and a cable 640. The cable 640 may correspond to the first cable 140 in FIG. 1. The second CMC 644 may correspond to the second CMC 144 located along the first cable 140 near the second PCB 120 in FIG. 1.

The second CMC 644 comprised a plurality of turns of the twisted pair cable 640 wound around a core. In an embodiment, the core is a medium bandwidth ferrite core, In another embodiment, the core is an air core.

FIG. 7 illustrates a second PCB 720 including a third CMC 746, a floating power supply 722, and a data Input/Output isolation circuit 724 and an isolation circuit according to an embodiment. The second PCB 720 also includes first, second, third, and fourth decoupling capacitors 702, 704, 706, and 708 and first and second impedance matching resistors 710a and 710b. The second PCB 720 may correspond to the second PCB 120 of FIG. 1.

The second PCB 720 provides galvanic isolation between the earth ground referenced circuitry on the left side of FIG. 7 and the floating high side ground referenced circuitry on the right side of FIG. 7. The floating power supply 722 may include, for example, a transformer-isolated power supply of the related arts. The data Input/Output (I/O) isolation circuit 724 may include, for example, Analog Devices LTM2810.

The floating power supply 722 may receive power in the form of supply voltages $V_{CC}$ and $V_{DD}$ referenced to an earth ground Gnd, and use them to generate supply voltages $V_{CCH}$ and $V_{DDH}$ referenced to the floating high side ground GndH.

The data I/O isolation circuit 724 may drive a differential HV gate signal $V_{HG}$ and $V_{HGbr}$ according to an earth-ground-referenced gate signal $V_G$. The data I/O isolation circuit 724 may also drive a earth-ground-referenced fault signal $V_{Fbar}$ according to a differential HV fault signal $V_{HFbr}$ and $V_{HFbr}$.

The supply voltages $V_{CCH}$ and $V_{DDH}$, the floating high side ground GndH, and the differential HV gate signal $V_{HG}$ and $V_{HGbr}$ may be provided to the twisted pairs of a cable 740 through the third CMC 746, and the differential HV fault signal $V_{HF}$ and $V_{HFbr}$ may be received from the cable 740 through the third CMC 746. First and second impedance matching resistor 710a and 710b may provide impedance matching for the differential HV fault signal $V_{HF}$ and $V_{HFbr}$, and may each have a resistance of 50 ohms.

The third CMC 746 comprised a plurality of turns of the twisted pair cable 740 wound around a core. In an embodiment, the core is a low frequency high permeability ferrite core. In another embodiment, the core is an air core.

Figure 8:
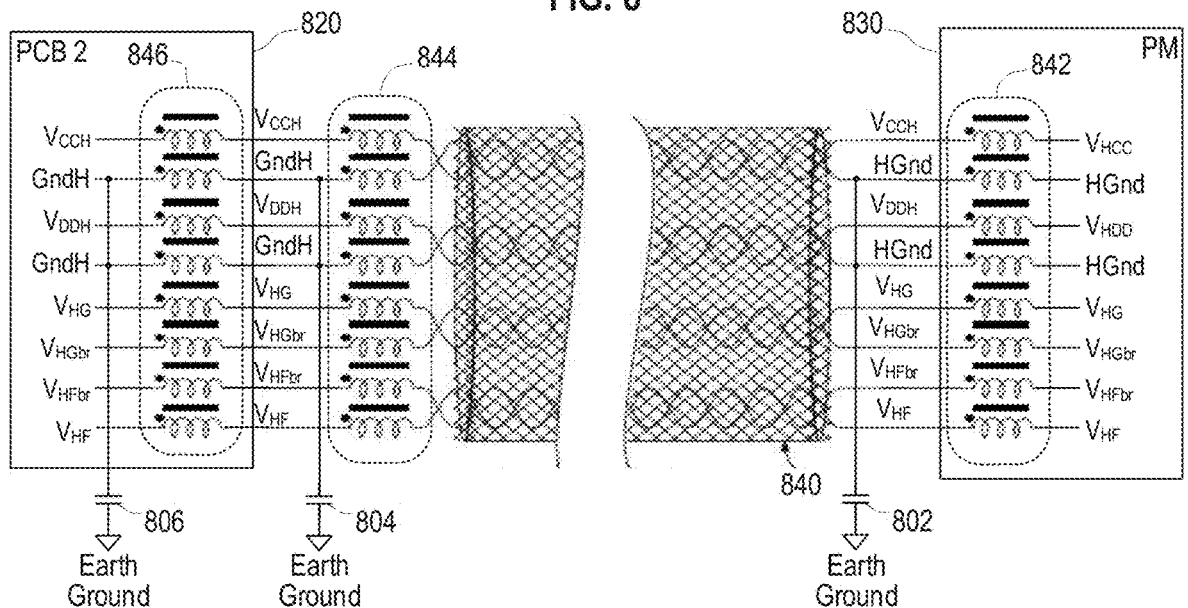
FIG. 8 illustrates three CMTs and a twisted pair cable according to an embodiment.

FIG. 8 illustrates first, second, and third CMTs 842, 844, and 846 and a twisted pair cable 840 according to an embodiment. FIG. 8 also shows a second PCB 820 and a power module 830. The above-listed elements of FIG. 8 may respectively correspond to the first, second, and third CMTs 142, 144, and 146, the twisted pair cable 140, the second PCB 120, and the power module 130 of FIG. 1.

FIG. 8 also illustrates the parasitic capacitances (PACs) of the three CMCs relative to earth ground: a first PAC 802 of the first CMC 842, a second PAC 804 of the second CMC 844, and a third PAC 806 of the third CMC 842. The CMCs and their respective PACs create dual poles at their respective time constants, according to:

$$t_{Tdelay} = \sqrt{L_T \cdot C} \quad \text{Equation 1}$$

wherein $t_{Tdelay}$ is the propagation delay through the CMC, $L_T$ is the open circuit inductance of the CMC, and C is the CMC parasitic capacitance to earth ground Accordingly, regarding FIG. 8, the first CMC 842 operates to creates a first delay $t_{T1delay}$ according to the first PAC 802 of the PM 830 relative to earth ground, the second CMC 844 operates to creates a second delay $t_{T2delay}$ according to the second PAC 804 of the cable 840 relative to earth ground, and the third CMC 846 operates to creates a third delay $t_{T3delay}$ according to the third PAC 806 of the second PCB 820 relative to earth ground. For CMTI noise this affects the total time the δV/δt noise takes to traverse from the PM 830 to the second PCB 820, which is the square root of the sums of all the root mean square delays.

When core materials are chosen such that the first CMC 842 uses a very low permeability core with very wide bandwidth then extremely high transient currents & voltages cause potentially high B and H fields, so the open circuit inductance $L_{T1}$ of the first CMC 842 may be approximately 1 microhenry (µH), and works against a first PAC 802 of the PM 830 of 20 picofarads (pF). The second CMC 844 uses a medium bandwidth core so that the open circuit inductance $L_{T2}$ of the second CMC 844 may be approximately 100 µH, and due to the 1 meter length, the second PAC 804 of the cable 840 may be 200 pF. The third CMC 846 uses a low frequency high permeability core so that the open circuit inductance $L_{T3}$ of the third CMC 846 may be approximately 10 millihenries (mH), with third PAC 806 of the second PCB 820 of 100 pF. Using these values, $$t_{T1delay} = \sqrt{L_{T1} \cdot C_{802}} = \sqrt{1\mu H \cdot 20pF} = 4.47 \text{ nanoseconds (ns)} \quad \text{Equation 2}$$

$$t_{T2delay} = \sqrt{L_{T2} \cdot C_{806}} = \sqrt{100\mu H \cdot 200pF} = 44.7 \text{ ns} \quad \text{Equation 3}$$

$$t_{T3delay} = \sqrt{L_{T3} \cdot C_{806}} = \sqrt{10000\mu H \cdot 200pF} = 447 \text{ ns} \quad \text{Equation 4}$$

wherein $C_{802}$, $C_{804}$, and $C_{806}$ are the respective capacitances of the first, second, and third PACs 802, 804, and 806. Accordingly, the total common mode latency is:

$$t_{CMdelay} = \sqrt{t_{T1dealy}^2 + t_{T2dealy}^2 + t_{T2dealy}^2} \quad \text{Equation 5}$$
$$= \sqrt{4.47^2 + 44.7^2 + x447^2} = 449 \text{ ns}$$

For reference, latency delay for a Cat 6 cable of length ~200 cm (2 meters) is equal to 4.4 ns*2=8.8ns. This is ~1/50th the time for common mode noise to traverse from the PM 830 back to the second PCB 820.

Embodiments of the system 100 of FIG. 1 improve switching behavior of the driven WBG power device 136 (for example, a SiC MOSFET) by co-packaging the gate driver 132 with it. This results in a lower gate to source inductances between the gate driver 132 and the WBG power device 136, which enables faster switching without associated overvoltages or spurious turn-on.

The PM 130 may include a power device 136 such as a power SiC MOSFET and associated components. Placing a high current gate driver (for example, an IXYS IXD 614 14 A gate driver) on the third PCB 132 directly mounted to a DCB substrate containing the power device 136 enables a major reduction of the series gate inductance between the gate driver output of the power device, but more importantly, it allows the unavoidable parasitic capacitances and inductances to be identified, determined, taken into account, simulated, and accommodated so that a critical damped step response requirement is achieved for the driven power device 136. The best series inductance of commercially available PCB daughter board gate drives for a PM or discrete SiC MOSFET is ~20 nH to 100 nH+, with input to the SiC MOSFET PM having parasitic inductances of 6 nH and up.

These values may be undefined or unspecified by the vendor, or if specified normal variation today from device to device and from manufacturer to manufacturer is large. Inevitable high speed ringing is observed in 100% of the gate wave forms captured or publicly presented as a result of the over stress of the SiC MOSFET gate oxide, limiting switching performance and resulting in field reliability issues.

Referring to FIG. 4, the third PCB 432 may comprise a Universal Gate Driver Amplifier (UGDA). Placing the UGDA within the PM 430 simplifies driving the PM 430 and significantly improve switching and communication feedback between the driven PM and the controller. The HV fault signal $V_{HFbr}$ output produced by the first comparator 454 is fed back to a controller through the second PCB 720 controller as the fault signal $V_{Fbr}$ as shown in FIG. 7.

The propagation delay from the desaturation voltage $V_{DSAT}$ through the first comparator 454 in FIG. 4 is a single comparator delay of ~10 ns. As the signal latency of to the cable is ~1 ns per 30 cm, if the total cable length is set to ~2 meters, then we expect no more than a total of 25 ns latency as a result of cabling. High speed signaling from the driven PM to the controller allows the possibility of adaptive dead time control for high power systems (for example, 165 kW systems), providing significant improvement in the control and efficiency of power electronics for main grid and other applications.

A UGDA having an output current range of +/−1 A to +/−14 A will support most SiC MOSFETs presently sold and adapted to a particular power device by changing the resistance value of the gate resistor, that is, of seventh resistor 422 of FIG. 4. In embodiments, the switching frequency of the UGDA may range from 1 kHz to 200 kHz, but embodiments are not limited thereto.

The UGDA according to an embodiment provides minimum input to output latency. The latency is limited to best commercial gate drives available in die form in embodiments that package bare dies of commercial gate drivers with commercial SiC MOSFETs in a power module. The limit in switching frequency of 200 KHz is determined primarily by the reciprocal of the gate driver input to resultant output latency.

An embodiment may use a 3.3 kV 50 A SiC MOSFET as the power device 436. The UGDA and DCB external parasitics such as the wire bond & trace inductances, inter layer PAC, and the SiC MOSFET model parameters may be used for full transient simulations. Parameters extracted from electro-magnetic simulations may be used. Accordingly, component values may be fixed, components for the PM 430 may be purchased, the PM 430 may be assembles and tested to assure compliance and verification of the models to the actual devices, and the improved models be used to improve subsequent PMs. Examples of components that may need adjusting include the desaturation/overcurrent blanking time, desaturation voltage threshold $V_{DSTH}$, and the series resistor 422 coupled between the output of the gate driver amplifier 450 and the gate of the power device 436.

Different specific component for the UGDA may be required for each of WBG Si, SiC or GaN MOSFETs power devices, as is the current industry practice. Mainly or wholly programmable external power components may be placed on the DCB.

In an embodiment, the UGDA can accommodate Vdd from +12 V to +30 V with regulated mid power supplies and −Vee charge pump from −5V to −10V, again via regulated mid power supplies as necessary. The UGDA may use a commercial capacitive charge pump IC (such as the Maxim MAX889 or equivalent) to implement the charge pump 460.

In an embodiment, only a positive power supply voltage $V_{DDH}$ is supplied by the commercial regulated power sources on the second PCB 120. Full galvanic isolation to 4 kV AC may be provided using high speed, low latency digital data couplers with CMTI δV/δt noise performance of 25V/ns or less, such as are available from Texas Instruments with a specified latency of 17 ns or from Maxim with a specified latency of 9 ns. Furthermore, an Analog Devices LTM2810 is a digital data couplers that provide power with input to output isolation of 7500 V and CMTI δV/δt performance of 50 V/ns; however, its input to output latency is 100 ns. These commercial optocouplers with their δV/δt specification should all be capable of accommodating 5V/ns. Or other types of high voltage data couplers may be used, such as the capacitive data couplers from Texas Instruments and the RF transformer data couplers from Analog Devices. Accordingly, the third CMC 146 of FIG. 1 (or the third CMC 746 of FIG. 7) may have a low frequency high permeability core material to take full advantage of the relatively benign δV/δt CMTI noise expected at that point in the signal chain.

Figure 9:
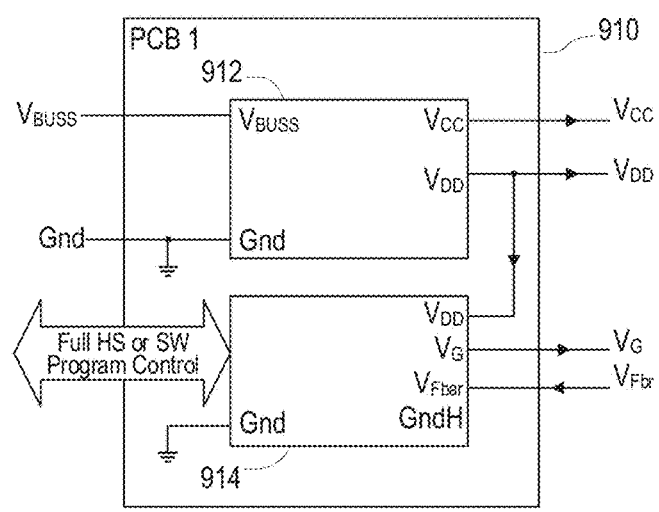
FIG. 9 illustrates a first PCB including a power supply and control circuit according to an embodiment.

FIG. 9 illustrates a first PCB 910 including a power supply 912 and controller 914 according to an embodiment. The first PCB 910, power supply 912, and controller 914 may respectively correspond to the first PCB 110, power supply 112, and controller 114 of FIG. 1.

The power supply 912 provides supply voltages $V_{CC}$ and $V_{DD}$ using energy from a power source $V_{BUSS}$. The controller 914 controls a gate signal $V_G$ according to hardware or software program control and the fault signal $V_{FBr}$ that corresponds to the HV fault signal $V_{HFbr}$ generated in a power module (PM) such as the PM 430 of FIG. 4.

Improving Common Mode Transient Immunity (CMTI)

High speed switching systems using the latest wide bandgap semiconductors require high side isolated gate drivers capable of Common Mode Transient Immunity, CMTI of greater than 200V/ns. The CMTI IP uses a specially selected magnetic toroid wound with a specially constructed cable. The CMTI, Common Mode Transient Immunity, circuit takes the very high dV/dt, ~200V/ns to ~1000V/ns, generated by the latest wide bandgap semiconductors such as SiC or GaN, and C (diamond) and reduces the δV/δt to a more manageable ~1V/ns to 50V/ns. In its simplest form the invention is a low pass filter; however, ordinary (non-common-mode) filtering may introduce unacceptable delays in signal propagation. Accordingly, a common-mode low pass filter (such as a common mode choke) for a differential signal may be used.

Figure 10:
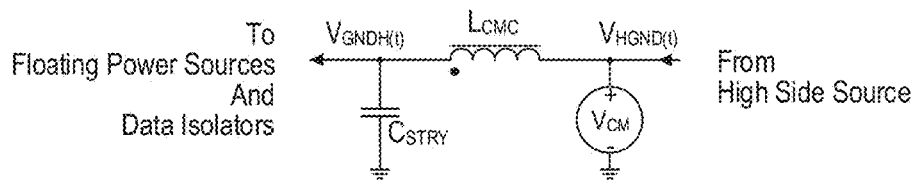
FIG. 10 illustrates a simplified circuit diagram of a CMC according to an embodiment.

FIG. 10 illustrates a simplified circuit configuration of a common mode choke (CMC) as seen by a common mode (that is, non-differential). $V_{HGND}(t)$ is the source of the high side power device output, and the origin of a very high $\delta V/\delta t$ common mode step, the $V_{GNDH}(t)$ is the high side common mode step after an passing through a CMC common mode inductance $L_{CMC}$, such as may be present at the data isolators and the floating power supply GNDH circuit of the second PCB 120 of FIG. 1. The CMC common mode inductance $L_{CMC}$ is located between $V_{HGND}(t)$ and $V_{GNDH}(t)$, and forms a simple second order, two pole roll-off filter network with the stray capacitance $C_{STRY}$ of the CMC and cable.

Figure 11:
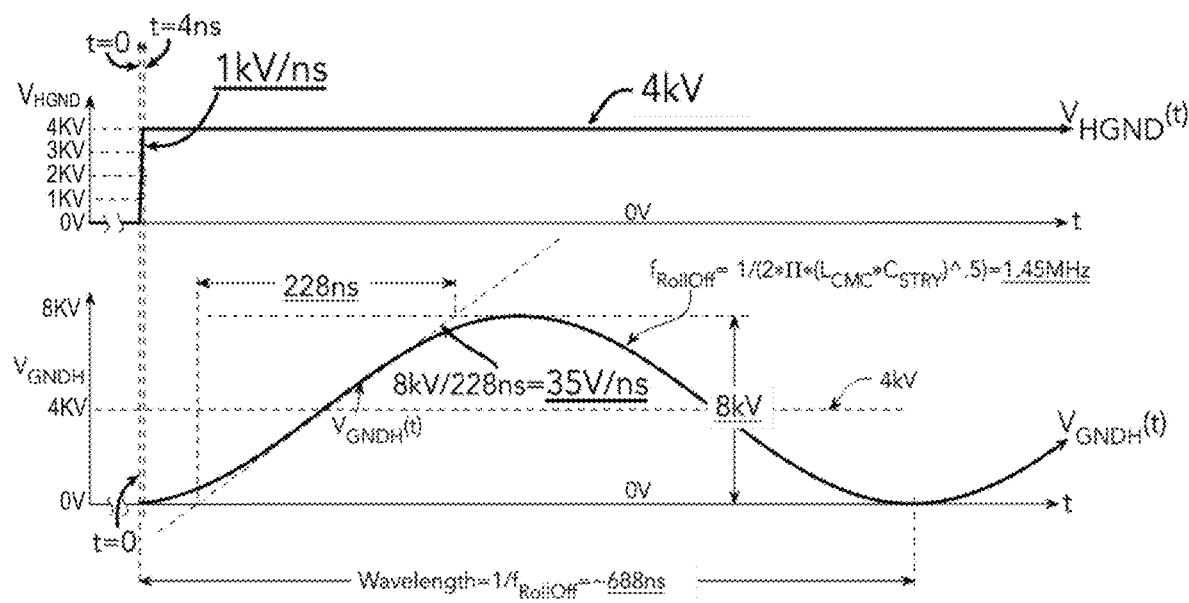
FIG. 11 illustrates a response of the circuit of FIG. 10 to a voltage step in an embodiment.

FIG. 11 illustrates a response of the circuit of FIG. 10 to a voltage step in an embodiment. The waveforms have been simplified for clarity.

First, it is assumed that the $V_{HGND}(t)$ source which creates $V_{CM}(t)=V_{HGND}(t)$ is a low impedance source so that the series output resistance can be ignored. Second, the resulting $V_{GNDH}(t)$ after passing through the low pass network of the CMC common mode inductance $L_{CMC}$ and the stray capacitance $C_{STRY}$ is an underdamped response, and assumes any loading on $V_{GNDH}(t)$ is minimal and can be ignored. With these assumptions, and selecting $L_{CMC}=300$ μH, and $C_{STRY}=40$ pF, the basic second order response is solved with the solution plotted as in FIG. 11 Using the frequency of the two pole roll-off $f_{rolloff}$ may be calculated as:

$$f_{rolloff} = \frac{1}{\sqrt{2 \cdot \pi \cdot L_{CNC} \cdot C_{STRY}}} = \frac{1}{\sqrt{6.28 \cdot 300\ \mu H \cdot 40\ pf}} = 1.454\ MHz \quad \text{Equation 6}$$

so that one full cycle takes $1/f_{rolloff}=688$ ns.

For all practical purposes, the loading of $V_{GNDH}$ is an open circuit. However, with poor layout and electro-magnetic-interference, EMI practices, it may be assumed that everything on $V_{GNDH}$ is radiated into free space. The characteristic impedance of free space is $Z_o=377$ ohms. A calculation for $\alpha=1/(377 \cdot 2 \cdot C_{STRY})=66$ μs, and $\tau=\sqrt{L_{CMC} \cdot C_{STRY}}=109.5$ ns. Since 109.5 ns<<66 us, $V_{GNDH}(t)$ is still a very underdamped oscillation as shown in FIG. 11 with a rolloff frequency $f_{rolloff}$ of 1.45 MHz, based on the values of $L_{CMC}$ and $C_{STRY}$ provided.

The waveforms shown in FIG. 11 are roughly to scale. So without doing a lot of math, the maximum slope of the waveform is measured graphically at 35V/ns. A common mode transient immunity, CMTI, of 35V/ns is acceptable and is much lower than the initial value of 1000V/ns.

Certainly, having an inductor in series with the floating gate driver has very consequential problems, among them the low pass filtering action of the resonant pole located at $f_{Rolloff}$ causes a time delay as shown in FIG. 11 of approximately $\tau=\sqrt{L_{CMC} \cdot C_{STRY}}$. Accordingly, instead of a simple inductor, a common mode choke (CMC) with an inductance whose value is $L_{CMC}$ is used as previously described, and as described in FIGS. 12-16, below.

Figure 12:
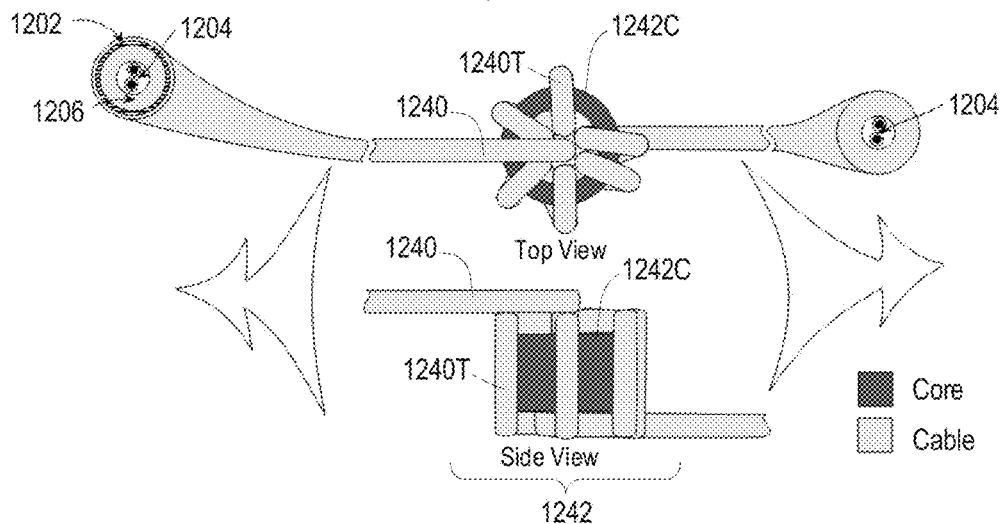
FIG. 12 illustrates a CMC according to another embodiment.

FIG. 12 illustrates a CMC 1242 according to another embodiment. The CMC 1242 comprises a toroidal core 1242C and a plurality of turns 1240T of a shielded twisted pair cable 1240, the turns 1242C being wrapped around the toroidal core 1242C.

The shielded twisted pair cable 1240 comprises a twisted pair 1204 of insulated conductors inside of a dielectric 1206. The dielectric is enclosed within a Faraday shield 1202, which may be made of metal foil, metal wires, or a combination thereof.

Figure 13:
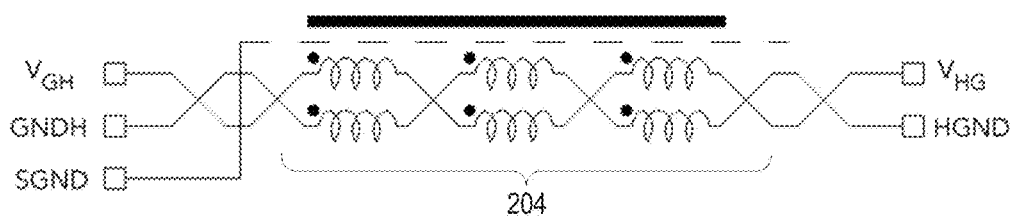
FIG. 13 illustrates a simplified circuit of the CMC of FIG. 12.

FIG. 13 illustrates a simplified circuit of the CMC 1242 of FIG. 12. As shown in FIG. 12, the conductors of the twisted pair 1204 may respectively receive, in this example, an input gate signal $V_{GH}$ and input ground GNDH, which respectively become an output gate signal $V_{HG}$ and an output ground HGND after passing through the CMC 1242. Furthermore, the Faraday shield 1202 is grounded on one (but only one) side of the CMC 1242.

As the name implies, the CMC 1242 creates an equal but opposite signal between the two terminals of the choke such that the inductive effect of $L_{CMC}$ of the CMC 1242 cancels for differential signals. For the signal on the twisted pair 1204 only the differential signal present between the input gate signal $V_{GH}$ and the input ground GNDH is transferred to the output gate signal $V_{HG}$ and the output ground HGND, with possible signal latency as a result of the finite velocity of signals within a cable of a specified length, approximately 3 ns/meter. The SGND is a Faraday shield connection to prevent and bypass the very high $\delta V/\delta t$ present on the $V_{HG}$ side, so that it does not capacitively couple to the $V_{GH}$ side, but instead, couples directly to system ground.

The CMC 1242 in FIG. 12 is based on a toroidal core but there are other constructions such as a "pancake" choke that is more suitable for a flat, power module. The inner and outer insulation thicknesses may be adjusted as necessary for expected operating voltages.

Figure 14:
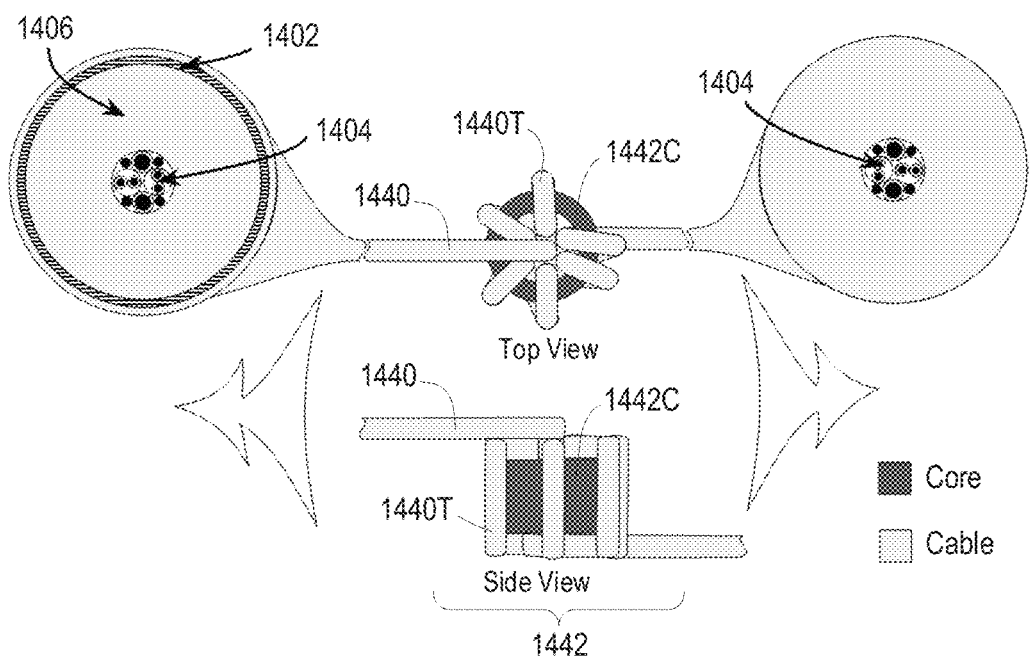
FIG. 14 illustrates a CMC according to another embodiment.

FIG. 14 illustrates an embodiment of a CMC 1442 designed to accept a cable 1440 with multiple insulated conductors for power delivery, multiple bare conductors for ground, and multiple twisted pairs for differential data symbols (indicated collectively as conductors 1404). In addition to the conductors 1404, the cable 1440 includes a dielectric 1406 and a Faraday shield 1402 such as described for the cable 1240 of FIG. 12. The CMC 1442 comprises a plurality of turns 1440T of the cable 1440 wrapped around a toroidal core 1442C.

Figure 15:
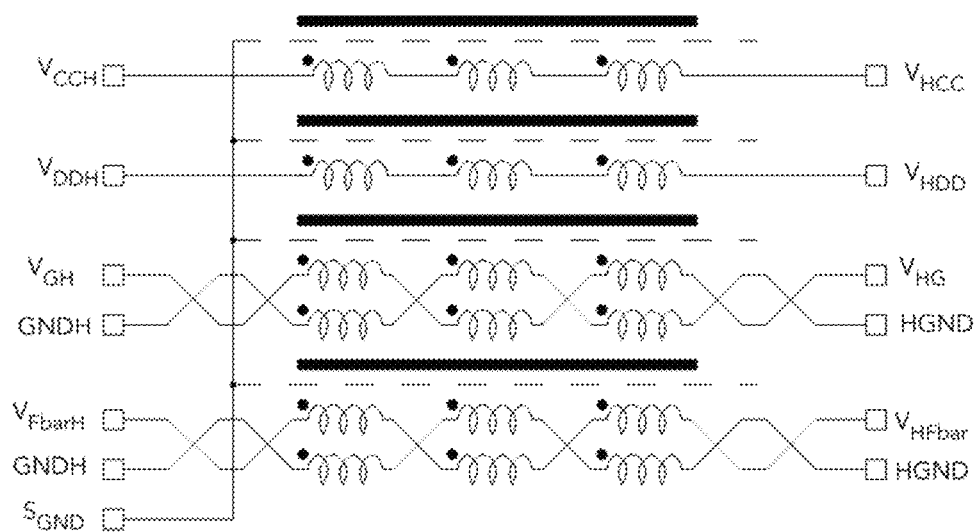
FIG. 15 illustrates a simplified circuit of the CMC of FIG. 14.

FIG. 15 illustrates a circuit diagram of the CMC 1442. In the CMC 1442 two sets of wires for power and two twisted pairs are connected between the GNDH side and the HGND side. As the salient features of FIG. 15 may be deduced from the description of FIG. 13, further description of FIG. 15 is omitted in the interest of brevity.

Figure 16:
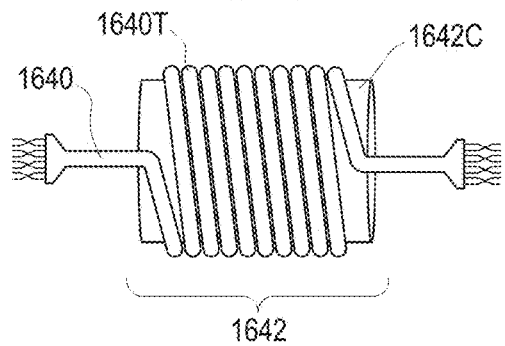
FIG. 16 illustrates an air core CMC according to an embodiment.

FIG. 16 illustrates a CMC 1642 according to another embodiment. The CMC 1642 accepts a cable 1640 including one or more twisted pairs, which in embodiments may be one of the cables 340, 440, 640, 1240, or 1440 described above. The CMC 1642 comprised a plurality of turns 1640T of the cable 1640 wrapped around a non-magnetic bobbin 1642C, which may be made, for example, of nylon, polyester, epoxy, or phenolic. In an embodiment, the CMC 1642 does not include the bobbin 1642C, and the plurality of turns 1640T are instead held in place by an adhesive, potting compound, ties (such as "zip ties") or the like.

The CMC 1642 is an air-core CMC that does not use a magnetic core. The CMC 1642 may therefore be useful in situations where a CMC using a magnetic core might saturate. To achieve the necessary inductance $L_{CMC}$, the CMC 1642 may include two or more meters of the cable 1640 in the plurality of turns 1640T.

Figure 17:
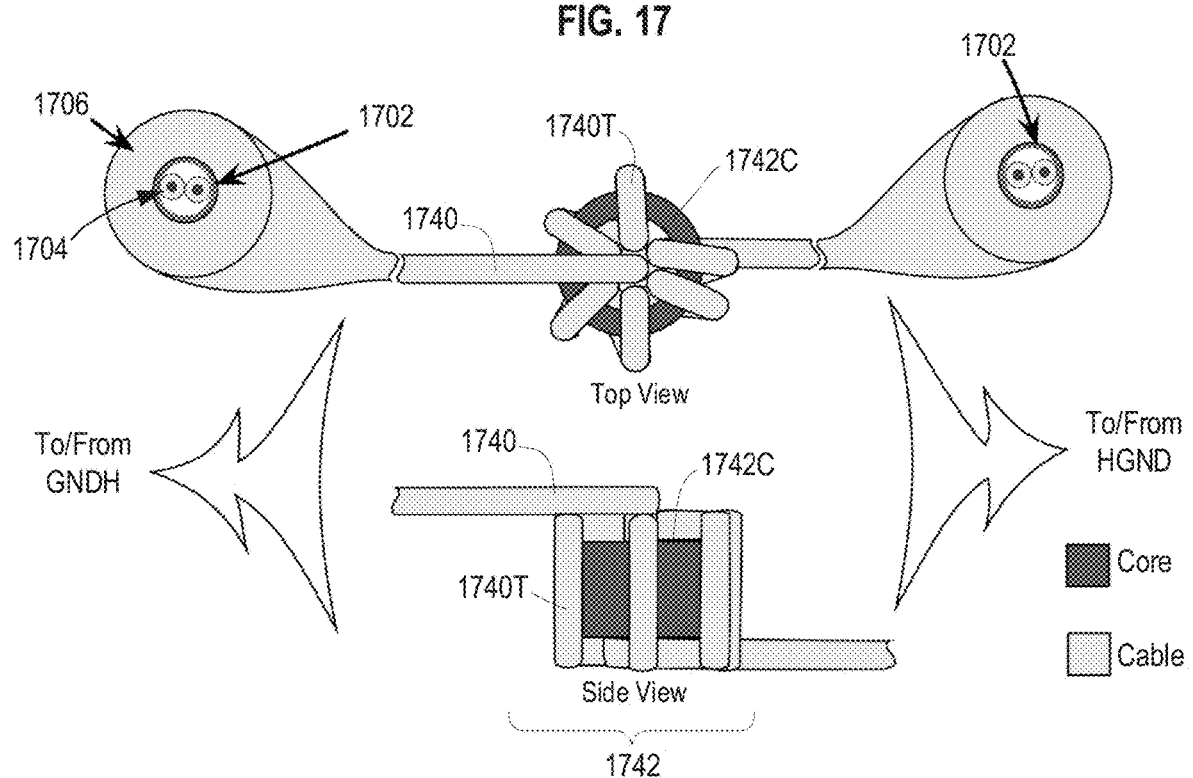
FIG. 17 illustrates a CMC according to another embodiment.

FIG. 17 illustrates a CMC 1742 according to another embodiment, in the case the CMC 1742 as a cable common mode choke using a toroid on a single shielded twisted wire pair cable with overall braided outer shielding for a Faraday shield, connecting GNDH to HGND. The CMC 1742 comprises a toroidal core 1742C and a plurality of turns 1740T of a shielded twisted pair cable 1740, the turns 1742C being wrapped around the toroidal core 1742C.

The shielded twisted pair cable 1740 comprises a twisted pair 1704 of insulated conductors inside of a dielectric 1706. The dielectric is enclosed within a Faraday shield 1702, which may be made of metal foil, metal wires, or a combination thereof.

Figure 18:
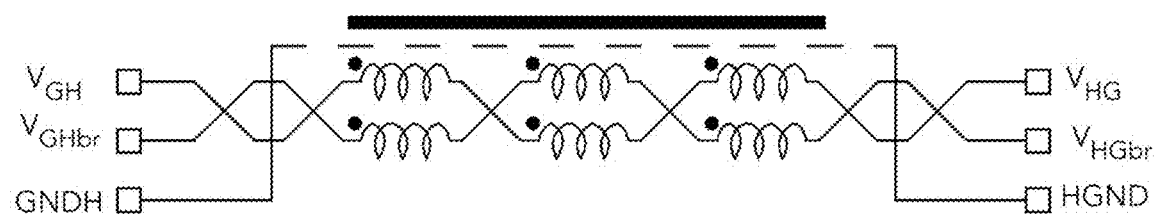
FIG. 18 illustrates a simplified circuit of the CMC of FIG. 17.

FIG. 18 illustrates a simplified circuit of the CMC 1742 of FIG. 17. As shown in FIG. 17, the conductors of the twisted pair 1704 may respectively receive, in this example, an input gate signal $V_{GH}$, its complementary $V_{GHbr}$, and input ground GNDH, which respectively become an output gate signal $V_{HG}$, $V_{HGbr}$, and an output ground HGND after passing through the CMC 1742. Furthermore, here, a CAT 7 cable's braided outer shield along with the fully conductive foil wrapped shields surrounding each the twisted wire pair forms a Faraday shield 1702 that is galvanically isolated from earth ground but is a quiet and a low CMTI environment of less than 10V/ns. In an embodiment, the other side of this cable becomes the first HGnd by traversing through the first CMT 142 of FIG. 1 as constructed using CAT 7 cable as in CMC 1742, or by CAT 6 cables without the Faraday shield.

As the name implies, the CMC 1742 creates an equal but opposite signal between the two twisted wire conductors contained within this choke such that the inductive effect of $L_{CMC}$ of the CMC 1742 are effectively cancelled from the GNDH side to the HGND side the for the differential signals contained within these twisted wire pairs. For the signal on the twisted pair 1704 only their differential signals present between the inputs $V_{GH}$ and $V_{GHbr}$ is transferred to the outputs as $V_{HG}$ and $V_{HGbr}$, with possible signal latency as a result of the finite velocity of signals within a cable of a specified length, approximately 3 ns/meter. In FIG. 18, GNDH, on the left is the braided shield in FIG. 17 serving as a Faraday shield in conjunction with HGND on the right to minimize the capacitive coupling of the very high common mode δV/δt present on the right $V_{HG}$ and $V_{HGbr}$ side directly to earth ground but only to the Faraday shield or HGND. In the same way, any direct coupling of $V_{GH}$ and $V_{GHbr}$ are prevented to earth ground but instead, these signals only couple directly to the Faraday shield or system ground GNDH. In this way, the Faraday shield of FIGS. 17 and 18 serves to preserve the differential nature of $V_{HG}$ and $V_{Hbr}$ on the right and $V_{GH}$ and $V_{GHbr}$ on the left.

The CMC 1742 in FIG. 17 is based on a toroidal core but there are other constructions such as a "pancake" choke that is more suitable for a flat, power module. The inner and outer insulation thicknesses may be adjusted as necessary for expected operating voltages.

Figure 19:
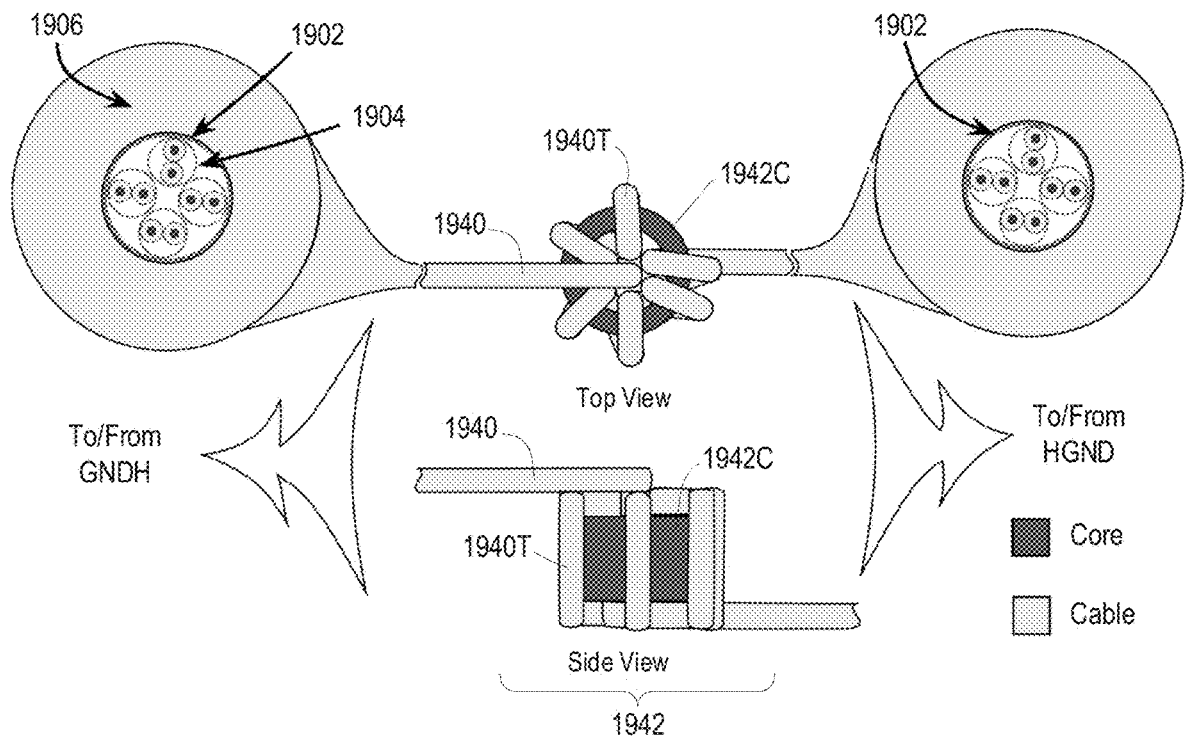
FIG. 19 illustrates a CMC according to another embodiment.

FIG. 19 illustrates an embodiment of a CMC 1942 that is a cable common mode choke using a toroid on a Cat 7 cable with overall shielding as a Faraday Shield, connecting GNDH to HGND. The CMC 1942 uses a CAT 7 cable versus an unshielded CAT 6 cable, designed to accept a cable 1940 with multiple twisted pairs for differential data signals (indicated collectively as conductors 1904). In addition to the conductors 1904, the cable 1940 includes a dielectric 1906 and a Faraday shield 1902 such as described for the cable 1240 of FIG. 17. The CMC 1942 comprises a plurality of turns 1940T of the cable 1940 wrapped around a toroidal core 1942C.

Figure 20:
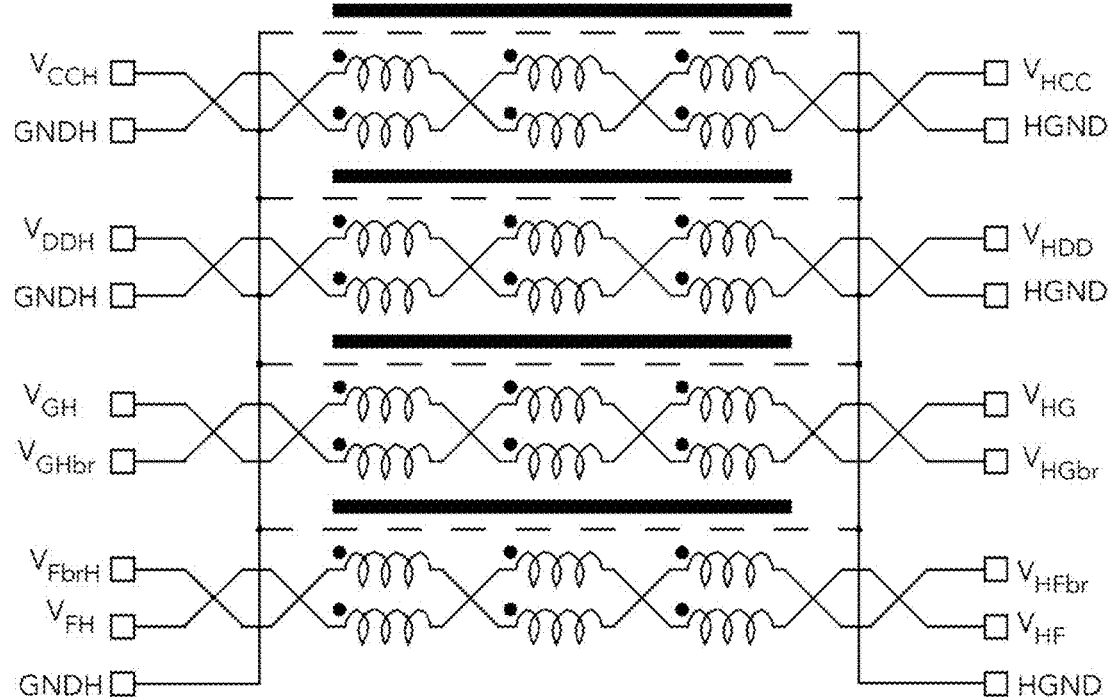
FIG. 20 illustrates a simplified circuit of the CMC of FIG. 19.

FIG. 20 illustrates a circuit diagram of the CMC 1942 with a CAT 7 cable. In the CMC 1942, two sets of wires provide power from left to right, $V_{CCH}$ to $V_{HCC}$ and $V_{DDH}$ to $V_{HDD}$ and their respective two twisted pairs of GNDH and the HGND. As the salient features of FIG. 20 may be deduced from the description of FIGS. 17 and 18, further description of FIG. 20 is omitted in the interest of brevity.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, a power device may have a metal pattern with different thicknesses on the front side and another metal pattern with different thicknesses on the backside to enable lifetime control treatment to be performed from the both sides. Accordingly, embodiments as set forth herein are intended to be illustrative and not limiting.

What is claimed is:

1. A transient noise reduction filter, comprising:
a cable including one or more twisted pairs of conductors; and
a first common mode choke (CMC) comprising a first plurality of turns of the cable,
wherein the cable supplies power and at least one signal to a power module comprising a high speed semiconductor power switch and a protection circuit, and
wherein the first plurality of turns of the cable includes a Faraday shield around the one or more twisted pairs of conductors.

2. The transient noise reduction filter of claim 1, wherein each of the one or more twisted pairs of conductors carries a data signal on a first conductor of the twisted pair and a ground on a second conductor of the twisted pair.

3. The transient noise reduction filter of claim 1, wherein the cable is a American National Standards Institute/Telecommunications Industry Association standard ANSI/TIA-568 Category 6, 6A, 7, or 8 cable.

4. The transient noise reduction filter of claim 1,
wherein the protection circuit is configured to detect an overcurrent, short-circuit, or desaturation condition in the power switch and in response initiate a shut-down cycle for the power switch in less than one microsecond.

5. The transient noise reduction filter of claim 1, wherein the protection circuit is configured to detect an overvoltage or avalanche breakdown of the power switch and in response turn on the power switch in less than ten nanoseconds.

6. The transient noise reduction filter of claim 1, wherein the power module comprises a sensing circuit capable of microvolt or millivolt precision in the presence of common mode electro-magnetic interference generated on the power module.

7. The transient noise reduction filter of claim 1, wherein the first CMC is an air-core CMC.

8. A transient noise reduction filter, comprising:
a cable including one or more twisted pairs of conductors;
a first common mode choke (CMC) comprising a first plurality of turns of the cable; and
a second CMC comprising a second plurality of turns of the cable,
wherein a portion of the cable between the first plurality of turns and the second plurality of turns is more than one meter long.

9. The transient noise reduction filter of claim 8, further comprising:
a third CMC comprising a third plurality of turns of the cable.

10. The transient noise reduction filter of claim 8, wherein the first CMC further comprises a magnetic core, and
wherein the plurality of turns of the cable are wrapped around the magnetic core.

11. The transient noise reduction filter of claim 10, wherein the magnetic core is a low frequency high permeability ferrite core.

12. The transient noise reduction filter of claim 8, wherein the cable supplies power and at least one signal to a power module, the power module comprising:
a high speed semiconductor power switch, and
a protection circuit.

13. A method of providing transient noise reduction on a cable including a twisted pair of conductors, comprising:
providing a first common mode choke (CMC) by forming a first plurality of turns of the cable around a first core; and
providing a second CMC by forming a second plurality of turns of the cable around a second core,
wherein the first core has a different permeability than the second core, a different bandwidth than the second core, or both, and
wherein forming the first plurality of turns of the cable includes forming the first plurality of turns of the cable around a non-magnetic core.

14. The method of claim 13, wherein the twisted pair of conductors is used to communicate a differential signal, and
wherein the transient noise reduction is provided to the differential signal.

15. A transient noise reduction filter comprising:
a cable including one or more twisted pairs of conductors; and
a first common mode choke (CMC) comprising a first plurality of turns of the cable,
wherein the cable supplies power and at least one signal to a power module comprising a high speed semiconductor power switch and a protection circuit,
wherein the first common mode choke (CMC) comprises a magnetic core,
wherein the first plurality of turns of the cable are wrapped around the magnetic core, and
wherein the magnetic core is a high frequency low permeability ferrite core.

* * * * *